United States Patent [19]
Singalewitch et al.

[11] 4,087,370

[45] May 2, 1978

[54] PHOTORESIST STRIPPER SYSTEMS

[75] Inventors: Joseph Don Singalewitch, Florham Park; Winifred Reinhardt, Pompton Lakes, both of N.J.

[73] Assignee: International Telephone & Telegraph Corporation, Nutley, N.J.

[21] Appl. No.: 676,595

[22] Filed: Apr. 13, 1976

Related U.S. Application Data

[62] Division of Ser. No. 520,590, Nov. 4, 1974, abandoned.

[51] Int. Cl.$^2$ .......................... B08B 3/08; C23G 5/02; C11D 7/26
[52] U.S. Cl. ....................................... 252/143; 134/3; 134/38; 134/41; 134/42; 252/170; 252/171
[58] Field of Search .............. 252/143, 144, 142, 79.1, 252/171, 170, 364; 134/3, 41, 38, 28, 42; 156/2, 668, 625, 904

[56] References Cited

U.S. PATENT DOCUMENTS 3,988,256  10/1976  Vandermey et al. ................ 252/171

*Primary Examiner*—Harris A. Pitlick
*Attorney, Agent, or Firm*—John T. O'Halloran; Peter C. Van Der Sluys

[57] ABSTRACT

This relates to a method and solution for removing exposed photopolymer film resist from a substrate. The substrate having the photoresist thereon is contacted with a solution consisting essentially of acid selected from the group consisting of the first three carboxylic acids and their halogenated derivatives, alcohol selected from the group consisting of the simple alcohols containing one to four carbon atoms per molecule and their halogenated derivatives, and water.

1 Claim, No Drawings

PHOTORESIST STRIPPER SYSTEMS

This is a division of application Ser. No. 520,590 filed Nov. 4, 1974, now abandoned.

BACKGROUND OF THE INVENTION

This invention relates to a method of removing plastic film from a substrate, and more particularly, to the removal of an exposed photopolymer film resist from printed circuit boards.

In the manufacture of printed circuits, an epoxy - glass cloth laminate board having a uniform thickness is laminated with or plated with a metal such as copper. Holes are then drilled in a predetermined pattern for accommodating various electrical components. Next, a film of partially polymerized plastic photoresist is deposited on the laminate. These photoresist films may commonly be composed of acrylic resins, polyvinyl cinnamates, diazo compounds, phenol-formaldehydes, polystyrene or other similar film-forming materials. This film is further polymerized, or crosslinked, by the action of ultraviolet light, into a hard chemically resistant film.

By using an appropriate glass or plastic maskant the resist film is selectively hardened in specific predetermined areas, while the resist film in other areas is left unchanged. The unchanged resist film is then dissolved in a "developer" by a solvent such as 1,1,1-trichloroethane or a solution of butoxyethanol and sodium carbonate or similar solutions. The copper in the cleaned areas may then be removed by etching or additional copper and other metals may be plated thereon.

In either event, it then becomes necessary to remove the exposed hardened resist film from the laminate.

It is known that such resist films can be removed by the action of strong organic solvents, such as methylene chloride or trichloroethylene. However, the use of strong organic solvents presents serious problems. They are extremely flammable and exhibit toxic effects when inhaled or contacted. The photoresist dissolves in the organic stripping liquid and eventually reaches a solubility saturation point beyond which the liquid is no longer useful and must be discarded. Since the solvents are not readily soluble in water, serious disposal problems are presented. While it is true that the saturated solution can be distilled to recover the solvent, this requires expensive and sophisticated equipment and controls.

Finally, these solvents are slow acting at room temperature and generally must be heated to a temperature between about 130° – 160° F to give reasonable stripping rates. Of course, increased temperature increases considerably the flammability and toxicity of the solvents and their vapors.

It is also known to use a stripping composition which is made in an aqueous form and usuable only with aqueous developed films. These are not considered suitable for stripping solvent-based resist films. The solutions consist of mixtures of strong alkalies such as sodium hydroxide, and particular organic solvents, such as ethylmonobutyl ether. As in the case of strong organic solvents, the use of these alkaline aqueous stripping solutions also presents the problems of toxicity, special disposal arrangements, and increased cost. Further, as in the case of strong organic solvents, the alkaline aqueous stripping solutions require heating for effective use. The use of higher temperatures increases the problems of flammability and toxicity and in addition, multiplies the corrosive effect of the strong alkaline components.

Printed circuit boards manufactured in accordance with either of the above described methods generally require subsequent treatment to fully remove photoresist residue and both may result in a discoloration of the copper.

SUMMARY OF THE INVENTION

It is an object of the present invention to provide a method of stripping exposed photopolymer film resist from printed circuit laminates without requiring the additional steps of heating the stripping solution prior to use and subsequent treatment of the laminate to remove photoresist residue.

It is a further object of the invention that the stripping solution be less toxic and less flammable.

It is a further object of the invention that the need for special disposal apparatus and techniques be avoided.

According to a broad aspect of the invention, there is provided a method of removing a selected exposed photopolymer film resist from a substrate, comprising: contacting said substrate with acids selected from the group consisting of the first three carboxylic acids and their halogenated derivatives.

According to a further aspect of the invention, there is provided a solution for removing selected exposed photopolymer film resists from substrates, said solution consisting of at least 20% by weight acids selected from the group consisting of the first three carboxylic acids and their halogenated derivatives and no more than 55% by weight of water, and the remainder alcohol selected from the group consisting of the simple alcohols containing one to four carbon atoms per molecule and their halogenated derivates.

The above and other objects will be more clearly understood from the following detailed description.

DESCRIPTION OF THE PREFERRED EMBODIMENT

Photoresist films have generally been considered immune to attack by weak acids and alcohols and water. However, it has been discovered that certain acids, considered "weak" acids, solutions of "weak" acids and water, solutions of "weak" acids and simple alcohols, and solutions of "weak" acids and simple alcohols and water, will remove certain resist films of both the aqueous and solvent type.

The acids which yield favorable results are the first three carboxylic acids (formic, acetic and propionic) and their halogenated derivatives such as, but not limited to, bromoacetic, monochloroacetic, and trichloroacetic.

The alcohols used in combination with the above mentioned acids are the simple alcohols containing one to four carbon atoms per molecule (methanol, ethanol, propanol and butanol) and their halogenated derivatives such as, but not limited to, 2-chloroethanol.

As indicated above, water may or may not be added to the solution.

TEST LAMINATE PREPARATION

A photoresist film having a nominal thickness of 2.0 mils, of a composition similar or equivalent to E. I. du Pont's Riston II 218R, is laminated to a substrate in accordance with the manufacturer's optimum recommendations and is held for 30–40 minutes in an environment which will prevent exposure of the photoresist film.

The laminate is then placed in contact with a photoaide. The photoaide is a clear film coated on one side with a photographic emulsion in incremental steps of opacity or optical density. The emulsion side of the photoaide is placed directly on the photoresist film and exposed to an appropriate light source in the optimum manner and time recommended by the manufacturer of the photoresist.

The exposed test laminate is then "developed" in accordance with the optimum recommendations of the manufacturer of the photoresist film. "Developing" consists of dissolving or otherwise removing that portion of the photoresist film which has not been exposed or polymerized.

The result of this procedure will be a test laminate wherein some of the incremental steps will still appear complete, having been sufficiently polymerized or hardened by the exposure to prevent attack by the developer liquid; some of the incremental steps will have completely disappeared, having been left sufficiently unchanged to be susceptible to attack by the developer liquid; and a small number of steps will have been partially dissolved or removed.

The "step held" is defined in the printed circuit industry as that step which, while partially attached or dissolved, still has resist film over at least 75% of its original area.

We define another step as the trial step of the test laminate. The trial step of the test laminate is the second step from the "step held" in the direction of greater polymerization and resistance to attack.

To test a particular stripping formulation, the stripping formulation is placed in a glass container at 20°–25° C. The test laminate is immersed in a vertical position in the stripping formulation with the trial step completely below the surface of the formulation. The time to strip is the time required for the photoresist film to leave the surface of the substrate or to be easily removable from the surface of the substrate with a wooden spatula.

EXAMPLE 1

The above mentioned acids and alcohols in various combinations were mixed in solutions consisting essentially of 20% by weight acid and 80% by weight alcohol. Copper clad laminates having thereon a 2 mil thick exposed photoresist film were placed in a bath solution. The time required to remove the exposed photoresist film at a temperature of approximately 22° C was measured and the results are shown in TABLE I below.

TABLE I

| Acid (20%) | Alcohol (80%) | Time (Minutes) |
| --- | --- | --- |
| Formic | Ethanol | 1–2 |
| Formic | 2-Propanol | 2–3 |
| Formic | 1-Butanol | 4–5 |
| Acetic | Ethanol | 2–3 |
| Acetic | 2-Propanol | 8–9 |
| Propionic | Ethanol | 3–4 |
| Propionic | 2-Propanol | 10–11 |
| Bromoacetic | Ethanol | 2–3 |
| Bromoacetic | 2-Propanol | 4–5 |
| Trichloroacetic | Ethanol | 2–3 |
| Trichloroacetic | 2-Propanol | 2–3 |

A solution of 11% by weight acid and 89% by weight alcohol was also tested. The results are shown in TABLE II.

TABLE II

| Acid (11%) | Alcohol (89%) | Time (Minutes) |
| --- | --- | --- |
| Acetic | Ethanol | 4–5 |
| Trichloroacetic | 2-Propanol | 6–7 |

Further, a solution of 3% by weight formic acid and 97% by weight methanol had a stripping time of 5 to 6 minutes, as also did a solution of 3% by weight formic acid and 97% by weight ethanol.

EXAMPLE 2

Solutions consisting essentially of 20% by weight acid, 40% by weight alcohol and 40% water were tested using a 2 mil photoresist film as in Example 1. The results are shown in Table III.

TABLE III

| Acid (20%) | Alcohol (40%) | Time (Minutes) |
| --- | --- | --- |
| Formic | Methanol | 9–10 |
| Formic | Ethanol | 4–5 |
| Formic | 2-Propanol | 4–6 |
| Acetic | Ethanol | 11–12 |
| Acetic | 1-Butanol | 5–6 |
| Propionic | Methanol | 15–16 |
| Propionic | Ethanol | 7–8 |
| Propionic | 2-Propanol | 6–7 |
| Bromoacetic | Ethanol | 4–5 |
| Bromoacetic | 2-Propanol | 4–5 |
| Trichloroacetic | Ethanol | 7–8 |
| Trichloroacetic | 2-Propanol | 7–8 |

Further, a solution of 20% by weight acetic acid, 40% by weight of 2-chloroethanol and 40% by weight water stripped a 2-mil photoresist film in 5 to 6 minutes.

EXAMPLE 3

Copper clad laminates having thereon a 1 mil thick exposed photoresist were contacted with solutions consisting essentially of various percentages by weight of acetic acid, monochloroacetic, 2-propanol and water. The stripping times are set forth below in TABLE IV

TABLE IV

| Acetic Acid (%) | Monochloro- acetic Acid (%) | 2-Propanol (%) | $H_2O$ (%) | Time (Min) |
| --- | --- | --- | --- | --- |
| 15 | 13 | 20 | 52 | 2–3 |
| 0 | 13 | 51 | 36 | 0–2 |
| 20 | 9 | 25 | 46 | 3–4 |
| 38 | 5 | 38 | 19 | 0–2 |
| 100 | 0 | 0 | 0 | 0–2 |
| 75 | 0 | 0 | 25 | 0–2 |
| 50 | 0 | 50 | 0 | 3–4 |
| 0 | 50 | 0 | 50 | 2–3 |
| 30 | 0 | 30 | 40 | 4–5 |
| 0 | 5 | 75 | 20 | 4–5 |
| 0 | 5 | 30 | 65 | 8–9 |
| 50 | 0 | 0 | 50 | 4–5 |
| 70 | 0 | 15 | 15 | 1–2 |

Use of the stripping solutions in examples 1, 2, and 3 yields a bright, fully clean copper surface after a single stripper contact, followed by water spray rinse. Using the prior art stripping solutions and techniques, additional steps are required to fully remove the resist residues and, as stated previously, discoloration of the copper may often occur.

The use of the single step stripping process will result in reduced labor cost and cycle time.

The inventive stripping solutions can be easily regenerated when the effectiveness of the solution decreases. It has been shown that the addition of water will precipitate dissolved resin, which may then be filtered out. The added water may then be removed from the solution by use of appropriate absorbing materials, or additions of the original acids and alcohols can be made to restore the solution to its initial ingredient proportions and effectiveness. Build-up of dye present in the resist can be avoided by the addition of absorbing agents during filtration.

Finally, the new stripping solutions can be legally disposed of by dilution and discharge to a sanitary sewer.

It will be apparent to those skilled in the art that various other ingredients may be added to the formulations revealed in this invention; these additions which may include wetting agents, stabilizers, odorants, antioxidants, colorants, buffering agents, preservatives or other materials for auxiliary purposes, without departing from the meaning and intent of this invention.

Additionally, the methods and conditions of contacting the photoresist film with the stripping liquid may be varied, e.g. immersion, spraying, agitation, foaming, etc., without departing from the meaning and intent of this invention.

What is claimed is:

1. A method of removing exposed photopolymer film resist from a substrate, comprising:
    contacting said substrate with a solution consisting essentially of at least 5% by weight monochloroacetic acid; 5 to 47% by weight acid selected from the group consisting of formic, acetic and propionic acids and their halogenated derivatives, 5 to 65% by weight water, and the remainder alcohol selected from the group consisting of methanol, ethanol, propanol and butanol and their halogenated derivatives.

* * * * *